United States Patent
Nagamine et al.

(10) Patent No.: US 9,175,379 B2
(45) Date of Patent: Nov. 3, 2015

(54) SPUTTER APPARATUS, CONTROL DEVICE FOR SPUTTER APPARATUS AND FILM FORMATION METHOD

(71) Applicant: Canon Anelva Corporation, Kawasaki-shi (JP)

(72) Inventors: Yoshinori Nagamine, Kawasaki (JP); Hiroshi Tsunematsu, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 343 days.

(21) Appl. No.: 13/721,894

(22) Filed: Dec. 20, 2012

(65) Prior Publication Data

US 2013/0161182 A1    Jun. 27, 2013

(30) Foreign Application Priority Data

Dec. 22, 2011 (JP) ................ 2011-282095

(51) Int. Cl.
| | |
|---|---|
| C23C 14/00 | (2006.01) |
| C23C 14/34 | (2006.01) |
| C23C 14/35 | (2006.01) |
| C23C 14/50 | (2006.01) |
| C23C 14/54 | (2006.01) |

(52) U.S. Cl.
CPC ............. *C23C 14/34* (2013.01); *C23C 14/35* (2013.01); *C23C 14/505* (2013.01); *C23C 14/54* (2013.01)

(58) Field of Classification Search
CPC .... C23C 14/542; C23C 14/505; C23C 14/042
See application file for complete search history.

(56) References Cited

U.S. PATENT DOCUMENTS

| | | | |
|---|---|---|---|
| 8,013,408 B2 | 9/2011 | Maehara et al. | |
| 2010/0213047 A1 | 8/2010 | Nagamine et al. | |
| 2010/0224482 A1* | 9/2010 | Yamaguchi et al. | 204/192.15 |
| 2010/0258432 A1* | 10/2010 | Ernult | 204/192.12 |
| 2011/0253037 A1 | 10/2011 | Tsunekawa et al. | |
| 2012/0193071 A1 | 8/2012 | Tsunekawa et al. | |

FOREIGN PATENT DOCUMENTS

JP    2001-240965 A    9/2001

* cited by examiner

*Primary Examiner* — Keith Hendricks
*Assistant Examiner* — Timon Wanga
(74) *Attorney, Agent, or Firm* — Fitzpatrick, Cella, Harper & Scinto

(57) ABSTRACT

In an embodiment of the present invention, the following operations are performed while a substrate holder is being rotated at a fixed rotation speed with plasma being generated. Specifically, a first state where a substrate holding surface of the substrate holder is exposed to a target holder is formed to start a first deposition of divisional depositions, and a second state where the surface is shut off from the target holder is formed in T/X seconds after the start of the first divisional deposition. Moreover, the first state is formed to start an n-th deposition of the divisional depositions when a reference point set on the substrate holder arrived at a position rotated by (n−1)×360/X degrees from a position of the reference point located at the start of the targeted deposition, and the second state is formed in T/X seconds after the start of the n-th divisional deposition.

5 Claims, 6 Drawing Sheets

TARGET HOLDER SIDE   thick                              thin

SPUTTER APPARATUS, CONTROL DEVICE FOR SPUTTER APPARATUS AND FILM FORMATION METHOD

CROSS-REFERENCES TO RELATED APPLICATIONS

This application claims the benefit of Japanese Patent Application No. 2011-282095, filed Dec. 22, 2011. The contents of the aforementioned application is incorporated herein by reference in its entirety.

BACKGROUND OF THE INVENTION

1. Field of the Invention

The present invention relates to a sputter apparatus, a control device for the sputter apparatus, and a film formation method, and more specifically relates to a sputter apparatus, a control device for the sputter apparatus, and a film formation method to be used to deposit a material on a substrate.

2. Description of the Related Art

Sputtering (hereinafter also referred to as sputter) is widely used as a thin-film formation method. In the case of sputter, a thin film deposited on a substrate to be processed generally has a film thickness distribution in the substrate surface. The following method has been known as a method of improving the film thickness distribution (see Japanese Patent Application Laid-Open No. 2001-240965).

In the method disclosed in Japanese Patent Application Laid-Open No. 2001-240965, the sputter is started using a target placed diagonally opposed to the substrate. Firstly, a deposition rate on the rotating substrate during the sputter is calculated, and a deposition time is calculated based on the deposition rate and a film thickness to be obtained. Then, a rotation speed of the substrate is controlled so that the substrate can rotate an integer multiple of times within the deposition time (that is, a deposition start angle and a deposition end angle of the substrate are set to be the same). It is disclosed that this control cancels out the unevenness in the film thickness in the substrate surface, and thereby improves the film thickness distribution.

In general, however, the deposition rate varies by a certain amount at the sputter starts, and requires a certain period of time is needed to stabilize the deposition rate. For this reason, even though the method as described in Japanese Patent Application Laid-Open No. 2001-240965 is performed, the thin film thus deposited has a film thickness distribution in the substrate surface.

SUMMARY OF THE INVENTION

In view of these problems, the present invention aims to provide a sputter apparatus, a control device for the sputter apparatus, and a film formation method that are capable of obtaining a favorable film thickness distribution in a film deposited by sputter.

A first aspect of the present invention is a sputter apparatus to generate plasma by applying a predetermined voltage to a target holder, and to thereby form a film by sputtering a target held by the target holder, comprising: a process chamber; a substrate holder provided inside the process chamber, having a substrate holding surface for holding a substrate, and configured to be capable of rotating the substrate holding surface about a predetermined rotation axis; rotational drive means for controlling rotation of the substrate holder; substrate rotation angle detection means for detecting a rotation angle of the substrate holder; a target holder provided inside the process chamber and configured to be capable of holding the target, the target holder provided so that the rotation axis is located at a position different from a perpendicular line passing through the center point of the target; a shutter configured to switch between a first state where the substrate holding surface is exposed to the target holder, and a second state where the substrate holding surface is shut off from the target holder; and control means for controlling the rotational drive means and the shutter, wherein provided that T seconds denotes a deposition time required to form a film thickness to be obtained in a targeted deposition, the sputter apparatus is configured to be capable of performing X (X is an integer of 2 or larger) divisional depositions to complete the targeted deposition, and the control means comprises: means for controlling the rotational drive means so that the substrate holder is rotated at a fixed rotation speed; means for controlling the shutter so that the first state is formed to start a first deposition of the divisional depositions, while the substrate holder is being rotated at the rotation speed under a condition where the plasma is being generated; means for controlling the shutter so that the second state is formed in T/X seconds after the start of the first divisional deposition, while the substrate holder is being rotated at the rotation speed under the condition where the plasma is being generated; means for controlling the shutter so that the first state is formed to start an n-th deposition of the divisional depositions when a reference point set on the substrate holder arrives at a position rotated by $(n-1) \times 360/X$ degrees (n is an integer of 2 to X) from a position of the reference point located at the start of the targeted deposition, on the basis of a detection result obtained by the substrate rotation angle detection means, while the substrate holder is being rotated at the rotation speed under the condition where the plasma is being generated; and means for controlling the shutter so that the second state is formed in T/X seconds after the start of the n-th divisional deposition, while the substrate holder is being rotated at the rotation speed under the condition where the plasma is being generated.

A second aspect of the present invention is a control device of a sputter apparatus to generate plasma by applying a predetermined voltage to a target holder, and to thereby form a film by sputtering a target held by the target holder, the sputter apparatus including: a process chamber; a substrate holder provided inside the process chamber, having a substrate holding surface for holding a substrate, and configured to be capable of rotating the substrate holding surface about a predetermined rotation axis; rotational drive means for controlling rotation of the substrate holder; substrate rotation angle detection means for detecting a rotation angle of the substrate holder; a target holder provided inside the process chamber and configured to be capable of holding the target, the target holder provided so that the rotation axis is located at a position different from a perpendicular line passing through the center point of the target; and a shutter configured to switch between a first state where the substrate holding surface is exposed to the target holder, and a second state where the substrate holding surface is shut off from the target holder, the control device configured to control the sputter apparatus so that the sputter apparatus performs X (X is an integer of 2 or larger) divisional depositions to complete a targeted deposition, provided that T seconds denotes a deposition time required to form a film thickness to be obtained in the targeted deposition, the control device comprising: means for controlling the rotational drive means so that the substrate holder is rotated at a fixed rotation speed; means for controlling the shutter so that the first state is formed to start a first deposition of the divisional depositions while the substrate holder is being rotated at the rotation speed under a condition where the plasma is being generated; means for controlling the shutter so that the second state is formed in T/X seconds after the start of the first divisional deposition, while the substrate holder is being rotated at the rotation speed under the condition where the plasma is being generated; means for controlling the shutter so that the first state is formed to start an n-th deposition of the divisional depositions when a reference point set on the substrate holder arrives at a position rotated by (n−1)× 360/X degrees (n is an integer of 2 to X) from a position of the reference point located at the start of the targeted deposition, on the basis of a detection result obtained by the substrate rotation angle detection means, while the substrate holder is being rotated at the rotation speed under the condition where the plasma is being generated; and means for controlling the shutter so that the second state is formed in T/X seconds after the start of the n-th divisional deposition, while the substrate holder is being rotated at the rotation speed under a condition where the plasma is being generated.

A third aspect of the present invention is a film formation method of generating plasma by applying a predetermined voltage to a target holder, and thereby forming a film by sputtering a target held by the target holder, the method comprising the steps of: provided that T seconds denotes a deposition time required to form a film thickness to be obtained in a targeted deposition, rotating substrate holder at a fixed rotation speed; and performing the targeted deposition by carrying out X (X is an integer of 2 or larger) divisional depositions while rotating the substrate holder at the rotation speed, each of the divisional depositions including performing a deposition just for T/X seconds, wherein the step of performing the deposition includes the steps of: starting a first deposition of the divisional depositions while rotating the substrate holder at the rotation speed; terminating the first divisional deposition in T/X seconds after the start of the first divisional deposition while rotating the substrate holder at the rotation speed; starting an n-th deposition of the divisional depositions when a reference point set on the substrate holder arrives at a position rotated by (n−1)×360/X degrees (n is an integer of 2 to X) from a position of the reference point located at the start of the targeted deposition, while rotating the substrate holder at the rotation speed; and terminating the n-th divisional deposition in T/X seconds after the start of the n-th divisional deposition while rotating the substrate holder at the rotation speed.

According to the present invention, a favorable film thickness distribution can be obtained in a film deposited by sputter.

DESCRIPTION OF THE EMBODIMENTS

Figure 1:
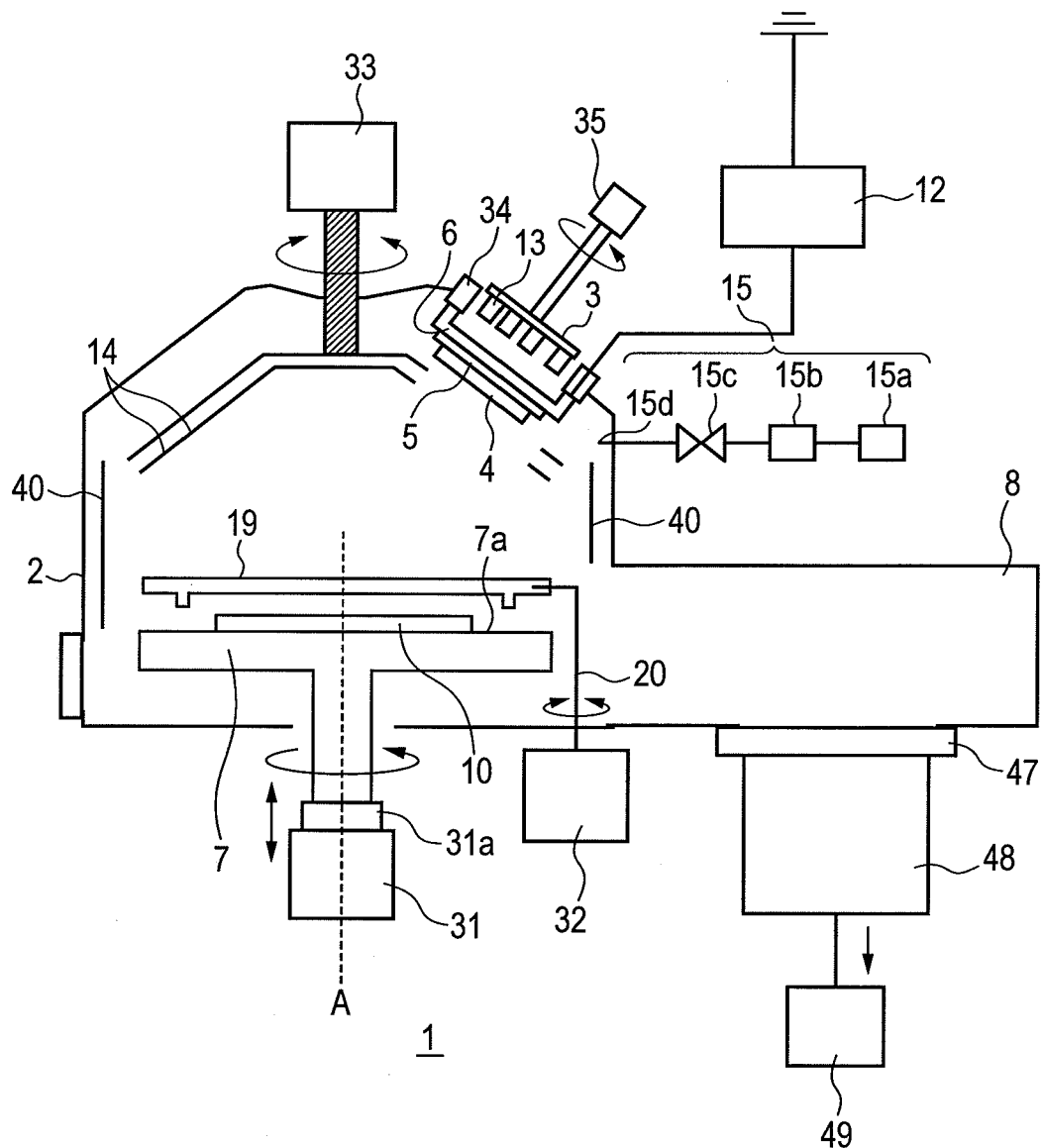
FIG. 1 is a schematic diagram of a configuration of a sputter apparatus according to an embodiment of the present invention.

Hereinafter, embodiments of the present invention are described with reference to the drawings, but the present invention should not be limited to the following embodiments. Here, component elements having one and the same function are provided with the same reference numeral in the drawings described below and the description thereof is omitted in some cases.

With reference to FIG. 1, description is provided for an overall configuration of a sputter apparatus (hereinafter also referred to as a "deposition apparatus") according to an embodiment of the present invention. FIG. 1 is a schematic diagram of a deposition apparatus 1 according to an embodiment of the present invention. The deposition apparatus 1 includes a vacuum chamber 2 as a process chamber, a vacuum pumping device including a turbo-molecular pump 48 and a dry pump 49 which are configured to exhaust air from the vacuum chamber 2 through an exhaust port 8, and a gas introduction system 15 capable of introducing a gas into the vacuum chamber 2.

The exhaust port 8 is a duct having a rectangular cross section, for example, and connects the vacuum chamber and the turbo-molecular pump 48. A main valve 47 is provided between the exhaust port 8 and the turbo-molecular pump 48.

The gas introduction system 15 includes a gas feeder (gas cylinder) 15a configured to supply a predetermined gas, a mass flow controller 15b configured to control a gas flow rate, a valve 15 configured to stop and start the supply of the gas, and a gas inlet port 15d configured to let the gas into the vacuum chamber 2 by connecting the component elements together. The component elements of the gas introduction system 15 are connected to each other by pipes and the predetermined gas is conveyed from the gas feeder 15a through the mass flow controller 15b, the valve 15c, and the gas inlet port 15d and introduced into the vacuum chamber from around a target 4. The gas introduction system 15 may include a decompression valve or a filter as needed. Such gas introduction system 15 has a configuration capable of stably providing a gas at a gas flow rate instructed by a control device 1000 to be later described.

Incidentally, in the case of performing ordinary sputter, an inert gas such as argon may be used as the above predetermined gas. In contrast, in the case of reactive sputter, a mixed gas of an inertia gas and a reactive gas may be used as the above predetermined gas. In the case of the reactive sputter, an inert gas and a reactive gas may be supplied individually, as a matter of course.

A target holder configured to be capable of holding a target is provided in the vacuum chamber 2 (in the process chamber). The target 4 having a to-be-sputtered surface exposed is held by the target holder 6 with a back plate 5 interposed in between. A substrate holder 7 configured to hold a substrate 10 is provided opposed to the target holder 6. The substrate holder 7 has a substrate holding surface 7a for holding the substrate 10, and is configured such that the substrate holding surface 7a can be rotated about a rotation axis A by a substrate holder driving mechanism 31 as rotational drive means to be described later.

An inner surface of the vacuum chamber 2 is grounded. A grounded tubular shield 40 (anti-adhesion shield member) is provided to the inner surface of the vacuum chamber 2 between the target holder 6 and the substrate holder 7. The shield 40 (anti-adhesion shield member) prevents or reduces adhesion of sputter particles directly to the inner surface of the vacuum chamber 2.

A magnet 13 for implementing magnetron sputtering is placed behind the target 4 when viewed from the to-be-sputtered surface. The magnet 13 is held by a magnet holder 3. The magnet holder 3 is connected to a magnet holder rotation mechanism 35 and is configured to be rotatable by being driven by the magnet holder rotation mechanism 35.

The target 4 is placed at a position (offset position) diagonally above the substrate 10. The center point of the to-be-sputtered surface of the target 4 is offset from the normal to the center point of the substrate 10 at a predetermined distance. In other words, the target holder 6 is provided so that the rotation axis A of the substrate holder 7 is located at a position different from the perpendicular line passing through the center point of the target 4. A power supply 12 as voltage supply means for applying power for sputter discharge is connected to the target holder 6. The deposition apparatus 1 illustrated in FIG. 1 includes, not but limited to, a DC power supply, but instead may include a RF power supply, for example. In the case of using the RF power supply, a matching box needs to be provided between the power supply and the target holder 6. The target holder 6 is insulated from the vacuum chamber 2 by an insulator 34, and is made of a metal such as Cu. Thus, the target holder 6 serves as an electrode when being supplied with DC or RF power. When power (a predetermined voltage) is supplied to the target holder 6, plasma is generated around the target and thereby deposition by sputtering is performed.

A target shutter 14 is provided near the target holder 6 in a way covering the target holder 6. The target shutter 14 has a double rotary shutter structure in which shutter members can be opened and closed independently of each other. Here, the number of shutters is not particularly limited. The target shutter 14 can switch between a close state where a blockage between the substrate holder 7 and the target holder 6 is made and an open state where the blockage between the substrate holder and the target holder 6 is removed. In addition, the target shutter 14 is provided with a target shutter driving mechanism 33 such that the double shutters can be opened and closed individually.

The substrate holder 7 is provided with the substrate holder driving mechanism 31 configured to move the substrate holder 7 in up-and-down directions, or rotate the substrate holder 7 at a predetermined speed. More specifically, the substrate holding surface 10 is driven to rotate about the rotation axis A by a motor included in the substrate holder driving mechanism 31, thereby rotating the substrate 10 about the rotation axis A. In addition, the substrate holder 7 is provided with a sensor 31a as substrate rotation angle detection means, and thereby is able to detect the rotation angle (rotation position) of the substrate 10. In an embodiment of the present invention, a rotary encoder is used as the sensor 31a. Note that an embodiment of the present invention may use any structure as the sensor 31a, as long as the structure can detect the rotation angle of the substrate holding surface 7a (in other words, the substrate 10 placed on the substrate holding surface 7a), for example, like the aforementioned rotary encoder. The control device 1000 to be described later is capable of controlling operations of the substrate holder driving mechanism 31, and is configured to receive, from the sensor 31a of the rotary encoder, rotation information of the motor included in the substrate holder driving mechanism 31, as a detection result obtained by the sensor 31a.

Moreover, a substrate shutter 19 is placed near the substrate 10 between the substrate holder 7 and the target holder 6. The substrate shutter 19 is supported by a substrate shutter support member 20 in a way covering the surface of the substrate 10. When a substrate shutter driving mechanism 32 rotates the substrate shutter support member 20, the substrate shutter 19 is inserted between the target 4 and the substrate 10 at a position near the surface of the substrate (close state). When the substrate shutter 19 is inserted between the target 4 and the substrate 10, the target 4 and the substrate 10 are shut off from each other. In contrast, when the substrate shutter 19 is retracted from between the target holder 6 (target 4) and the substrate holder 7 (substrate 10) by an operation of the substrate shutter driving mechanism 32, the space between the target holder 6 (target 4) and the substrate holder 7 (substrate 10) is opened (open state).

The power supply 12 to apply the power for sputter discharge, the gas introduction system 15, the substrate holder driving mechanism 31, the substrate shutter driving mechanism 32, the target shutter driving mechanism 33, the magnet holder rotation mechanism 35, and the gate valves are electrically connected to the control device 1000, and the control device 1000 is configured to be capable of controlling these component elements.

Figure 2:
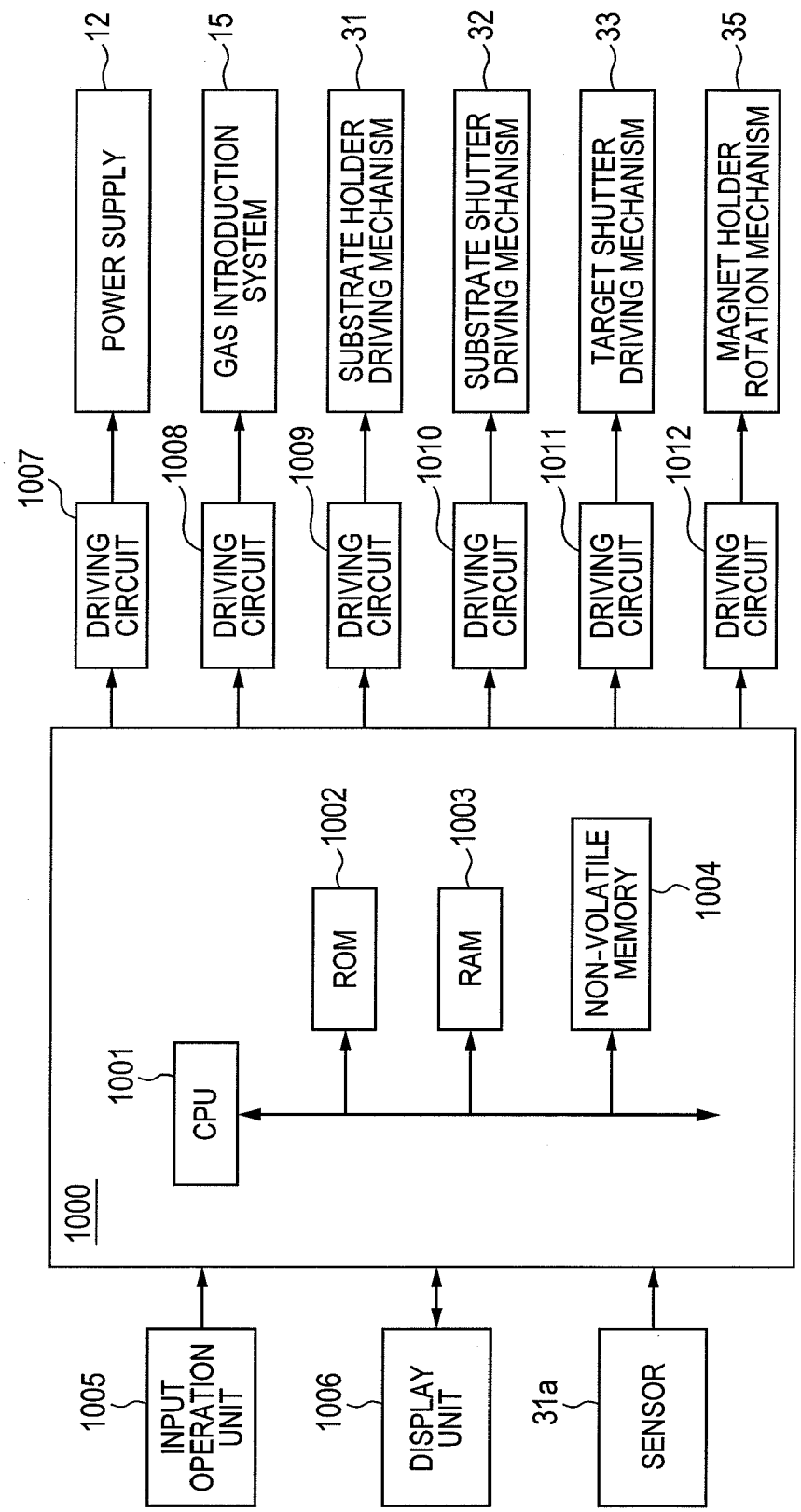
FIG. 2 is a block diagram illustrating a schematic configuration of a control system in a sputter apparatus according to an embodiment of the present invention.

FIG. 2 is a block diagram illustrating a schematic configuration of a control system of the sputter apparatus 1 according to an embodiment of the present invention.

In FIG. 2, the control device 1000 is a control unit as control means for controlling the entire sputter apparatus 1. This control device 1000 includes a CPU 1001 to perform various processing operations such as computation, control and judgment, and a ROM 1002 for storing therein a control program, for example, to be executed by the CPU 1001 for processing to be described later in FIG. 4 and the like. The control device 1000 includes a RAM 1003 for temporarily storing therein data under processing operations in CPU 1001, input data and the like, a non-volatile memory 1004 and the like. Moreover, an input operation unit 1005 and a display unit 1006 are connected to the control device 1000. The input operation unit 1005 includes a keyboard or various kinds of switches with which a certain instruction, data or the like is inputted, and the display unit 1006 makes various kinds of display of things such as the input and setting states of the sputter apparatus 1. Further, the sensor 31a to detect the rotation angle of the substrate 10 held on the substrate holder 7 is connected to the control device 1000. In addition, the power supply 12, the gas introduction system 15, the substrate holder driving mechanism 31, the substrate shutter driving mechanism 32, the target shutter driving mechanism 33, and the magnet holder rotation mechanism 35 are connected to the control device 1000 via respective driving circuits 1007 to 1012.

Here, a film formation method according to an embodiment of the present invention is described.

In the embodiment of the present invention, a deposition time T (T seconds) denotes a time period of the deposition of a to-be-formed film (targeted deposition) from the start of the targeted deposition until a desired film thickness (film thickness to be obtained) is obtained. In other words, the deposition time T is a time period required to form a to-be-formed film having a film thickness to be obtained by deposition at a predetermined deposition rate, and is a time period during which the formation of a predetermined film is actually performed on a substrate. Hence, the deposition time T does not includes a time interval between divisional depositions. The deposition time T may be calculated based on the deposition rate and the aforementioned film thickness to be obtained, or may be inputted as a parameter by a user.

In the embodiment of the present invention, in the targeted deposition, the deposition time T is divided by X (X is an integer of 2 or larger), and X divisional depositions are performed. Thus, as a result of performing X divisional depositions, the deposition for the deposition time T is performed and thereby the film with the film thickness to be obtained is formed. Specifically, in the above targeted deposition, the divisional depositions are performed while the substrate holder 7 is continuously being rotated at a fixed rotation speed.

More specifically, while the substrate holding surface 7a (substrate 10) is being rotated at the fixed rotation speed, a first divisional deposition is performed and the first divisional deposition is once terminated after the deposition just for T/X seconds. Here, θ denotes a rotation angle of a reference point set on the substrate holding surface 7a (this means the same as a reference point set on the substrate 10) from the start of the first divisional deposition (i.e., from the start of the targeted deposition). At the start of the first divisional deposition, the rotation angle θ is 0 degrees. Then, when the rotation angle of the reference point set on the substrate holding surface 7a from the start of the targeted deposition becomes 360/X degrees, the deposition is restarted (a second divisional deposition is started), and the second divisional deposition is terminated after the deposition just for T/X seconds, again. If X is three or larger, the deposition is then restarted (a third divisional deposition is started) when the rotation angle θ of the reference point set on the substrate holding surface 7a from the start of the targeted deposition becomes 2×360/X degrees, and the third divisional deposition is terminated after the deposition just for T/X seconds, again. In summary, while the substrate holder 7 is being rotated at the fixed rotation speed, the second and following divisional depositions are performed in such a way that an n-th divisional deposition (n is an integer of 2 to X) is started when the rotation angle θ of the reference point set on the substrate holding surface 7a from the start of the targeted deposition becomes (n−1)×360/X degrees and that the n-th divisional deposition is terminated after the deposition just for T/X seconds. In this way, in the embodiment of the present invention, while the substrate holder 7 (more specifically, the substrate holding surface 7a and the substrate 10) is being rotated at the fixed rotation speed, a deposition is carried out just for T/X seconds (n-th divisional deposition) after starting when the reference point set on the substrate holder (the reference point on the substrate holding surface 7a) arrives at the position rotated just by (n−1)×360/X degrees from the position of the reference point located at the start of the targeted deposition.

Figure 3:
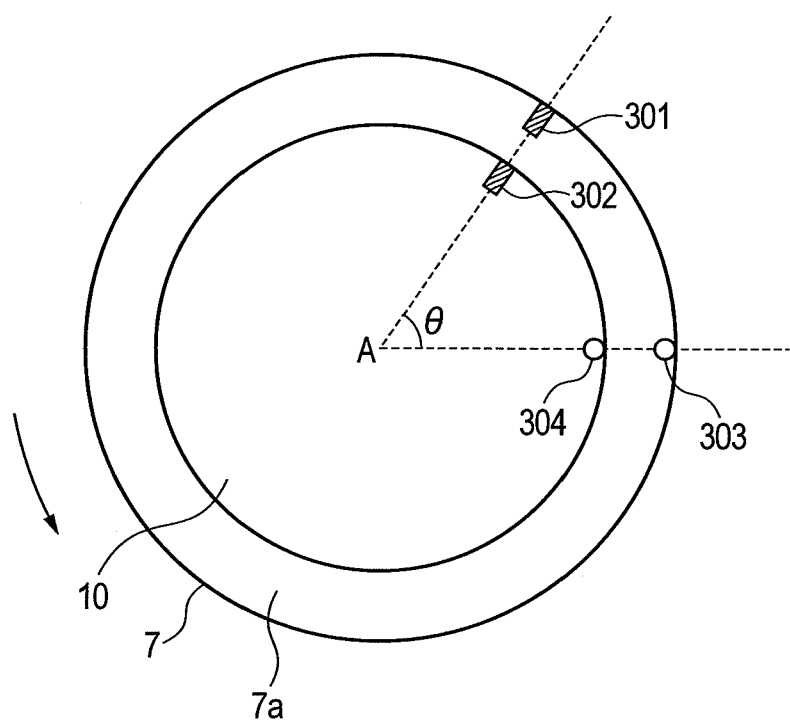
FIG. 3 is a diagram for explaining a rotation angle according to an embodiment of the present invention.

The above rotation angle θ is an angle (rotation phase) of the substrate holding surface 7a that is a certain angle, only by which the substrate holding surface 7a is rotated about the rotation axis A. FIG. 3 is a diagram for explaining the rotation angle θ according to an embodiment of the present invention. In FIG. 3, the substrate holding surface 7a is provided with a reference point 301, and the substrate 10 is provided with a reference point 302. The reference points 301, 302 each may be a physical structure such as a notch, or may be a virtual point. Assuming that the reference points 301, 302 are located at positions 303, 304, respectively, at the start of the first divisional deposition (that is, at the start of the targeted deposition), the rotation angle θ (0 degrees≤θ<360 degrees) is the rotation phase of the reference points 301, 302 in the rotation from the positions 303, 304 since the substrate holding surface 7a is being rotated at the fixed rotation speed.

First Embodiment

In this embodiment, the control (start and termination) of divisional depositions is carried out by controlling supply of a predetermined voltage for plasma generation from the power supply 12 as voltage supply means to the target holder 6 as a cathode. Accordingly, the control device 1000 is configured to control the power supply 12 so that the power supply 12 supplies the predetermined voltage to the target holder 6 in order that each of X divisional depositions can be performed just for T/X seconds, while causing the substrate holder 7 (substrate holding surface 7a) to rotate at the fixed rotation speed by controlling the substrate holder driving mechanism 31. More specifically, the control device 1000 is configured to cause the first divisional deposition to be performed just for T/X seconds by controlling the power supply 12 so that the power supply 12 supplies the predetermined voltage to the target holder 6 just for T/X seconds, with the setting of the rotation angle θ of the substrate holder 7 at the start of the first divisional deposition (that is, at the start of the targeted deposition) to θ=0 degrees. Moreover, the control device 1000 is configured to cause each of the second and following divisional depositions to be performed just for T/X seconds by controlling the power supply 12 so that, at a time when the rotation angle θ of the substrate holder 7 from the start of the targeted deposition becomes (n−1)×360/X degrees, the power supply 12 supplies the predetermined voltage to the target holder 6 just for T/X seconds.

Here, description is provided for an example in which film deposition is preformed with the settings of a deposition time of T=4.0 seconds, and a rotation speed of the substrate holder 7 of 60 rpm. In addition, it is assumed that the reference point 302 in FIG. 3 is a notch formed in the substrate 10 (hereinafter also referred to as a notch 302) and that a reference angle (the rotation angle θ=0 degrees) is set to a position where the reference point 302 (i.e., the reference point 301) comes closest to the target holder 6 as the cathode. Since the targeted deposition (first divisional deposition) is started when the notch 302 comes to this position, this position is the position 304 (position 303) in FIG. 3. In this embodiment, the substrate 10 is placed on the substrate holding surface 7a with the notch 302 located at the position closest to the target holder 6 in a state where the rotation of the substrate holder 7 is stopped, for example. When the substrate holding surface 7a is rotated from this state, the control device 1000 can detect the rotation angle of the substrate holding surface 7a from the detection result by the sensor 31a, and thereby can detect the rotation angle of the notch 32 from the position 304, i.e., the rotation angle θ.

Here, in this embodiment, it is not essential to use the notch 302 as a reference to detect the rotation angle. Instead, what is important in this embodiment is to detect the rotation angle from the start of the targeted deposition at a certain time after the start of the targeted deposition (the start of the first divisional deposition). Hence, the control device 1000 may have to be configured to be capable of detecting the rotation angle from the start of the targeted deposition at a predetermined time on the basis of the rotation information acquired from the sensor 31a.

Figure 4:
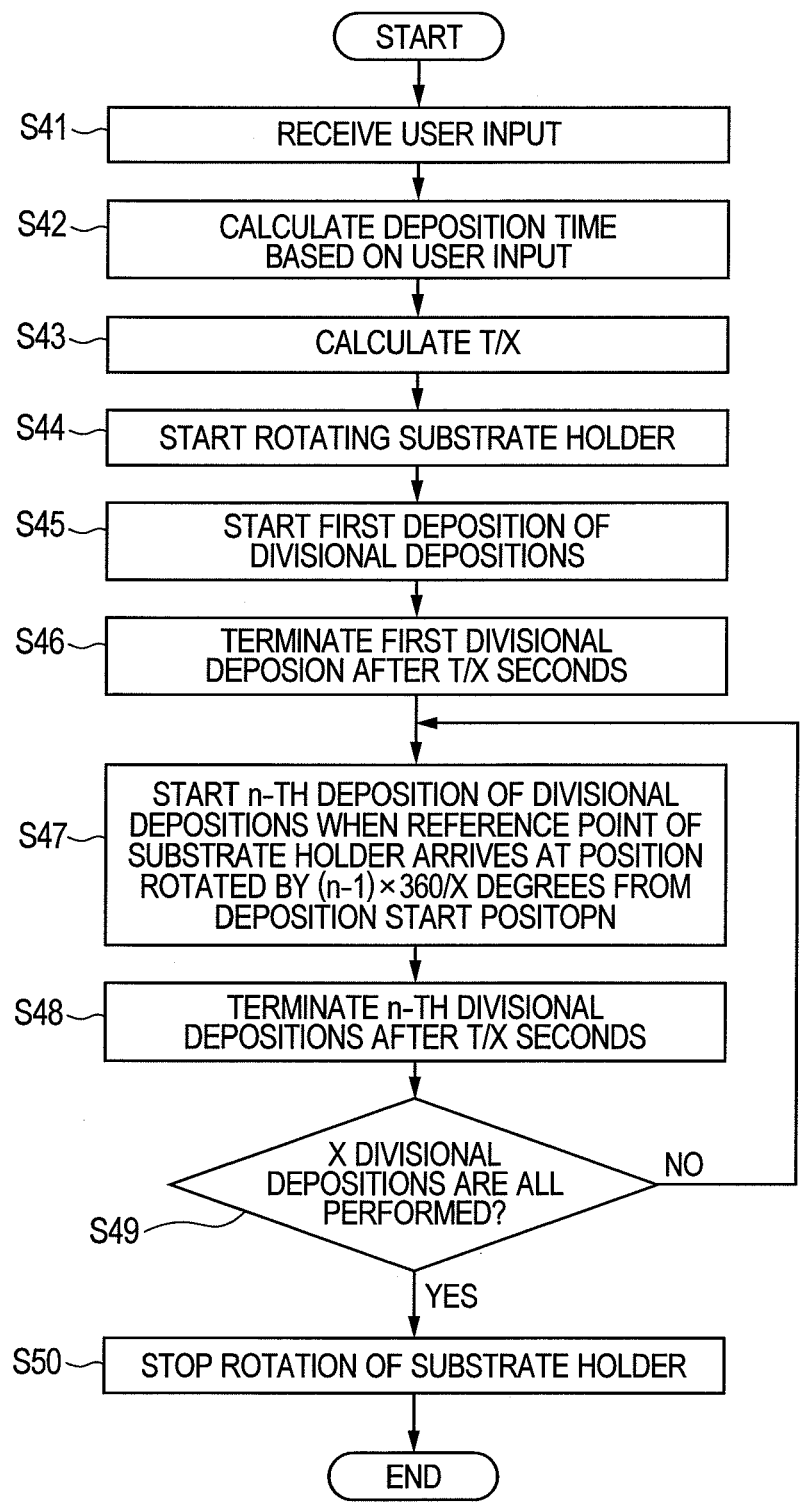
FIG. 4 is a flowchart illustrating a procedure of a film formation method according to an embodiment of the present invention.

FIG. 4 is a flowchart illustrating a processing procedure of a film formation method in this embodiment in which a targeted deposition is performed by X divisional depositions. Hereinafter, steps of the film formation method are explained with reference to this flowchart. Specifically, when the film formation method according to this embodiment is started, the control device 1000 executes the following deposition operation sequence according to the flowchart illustrated in FIG. 4.

Incidentally, a value X (an integer of 2 or larger) that is the number of divisional depositions may be updated every targeted deposition or may be held as a default value by the sputter apparatus 1. In either case, the X value may be stored in the non-volatile memory 1004 or the like.

In step S41, the control device 1000 receives user input on the deposition rate and the film thickness to be obtained (hereinafter, also simply referred to as the "targeted film thickness") in the targeted deposition. More specifically, when a user inputs a desired deposition rate and a targeted film thickness through the input operation unit 1005, the control device 1000 stores, in the RAM 1003, the deposition rate and the targeted film thickness inputted by the user.

In step S42, the control device 1000 reads the deposition rate and the targeted film thickness stored in the RAM 1003 in step S41, calculates the deposition time T of the targeted deposition based on the read deposition rate and targeted film thickness, and stores the deposition time T in the RAM 1003. Instead, a predetermined deposition time T may be stored in the RAM 1003.

In step S43, the control device 1000 reads the X value from the non-volatile memory 1004, reads the deposition time T calculated in step S42, and calculates T/X. The control device 1000 stores, in the RAM 1003, T/X thus calculated, which is equivalent to a deposition time for each of the divisional depositions.

In step S44, the control device 1000 controls the substrate holder driving mechanism 31 so that the substrate holder 7 is rotated at a predetermined rotation speed. In this embodiment, since the rotation speed of the substrate holder 7 is set to 60 rpm, the control device 1000 controls the substrate holder driving mechanism 31 so that the substrate holding surface 7a can rotate about the rotation axis A at 60 rpm.

In step S45, the control device 1000 performs control to start a first deposition of X divisional depositions into which the targeted deposition is divided. In this embodiment, the control of the start and termination of the deposition of each divisional deposition is performed by controlling the ON/OFF of supply of the predetermined voltage to the target holder 6 as the cathode from the power supply 12 as a voltage supply mechanism for supplying a voltage for plasma generation. Accordingly, the control device 1000 controls the power supply 12 so that the power supply 12 supplies the predetermined voltage to the target holder 6, thereby causing the first divisional deposition to start. Needless to say, in the first divisional deposition, the control device 1000 sets various conditions such that deposition can be performed at the deposition rate inputted in step S41. At this time, the control device 1000 stores in the RAM 1003 a count 1 associated with the number of divisional depositions. In this embodiment, the "count N" is cumulatively incremented by 1 every time a divisional deposition is performed, and the cumulative count value is stored in the RAM 1003.

In addition, in the case where at least one of the target shutter 14 and the substrate shutter 19 is in the close state, the control device 1000 turns the shutter in the close state into the open state by controlling at least one of the substrate shutter driving mechanism 32 and the target shutter driving mechanism.

In step S46, in T/X seconds after the start of the first deposition of the divisional deposition in step S45, the control device 1000 performs control to terminate the first deposition of the divisional depositions. To be more specific, the control device 1000 reads T/X from the RAM 1003, and controls the power supply 12 so that the power supply 12 stops supplying the predetermined voltage to the target holder 6 upon lapse of just T/X seconds after the start of the first divisional deposition in step S45. Under this control, the deposition is performed on the substrate 10 just for T/X seconds.

In step S47, when the notch 302 as the reference point set on the substrate (i.e., the reference point 301 set on the substrate holder) comes to the position at (n−1)×360/X degrees (n is an integer of 2 to X) from the position 304 (position 303) of the notch 302 located at the start of the targeted deposition, the control device 1000 performs control to cause an n-th deposition of the divisional depositions to start. To be more specific, based on the rotation information received from the sensor 31a, the control device 1000 causes the n-th divisional deposition to start by controlling the power supply 12 so that the power supply 12 supplies the predetermined voltage to the target holder 6, when the rotation angle θ of the notch 302 as the reference point from the position 304 as the start position of targeted deposition becomes (n−1)×360/X degrees. Needless to say, in the n-th divisional deposition, the control device 1000 sets various conditions such that deposition can be performed at the deposition rate inputted in step S41. At this time, the control device 1000 cumulatively increments, by one, the count associated with the number of divisional depositions, and stores the cumulative count value in the RAM 1003.

In step S48, in T/X seconds after the start of the n-th deposition of the divisional depositions in step S47 (when T/X seconds elapses after the start of the n-th deposition of the divisional depositions in step S47), the control device 1000 performs control to terminate the n-th deposition of the divisional depositions. To be more specific, the control device 1000 reads T/X from the RAM 1003, and controls the power supply 12 so that the power supply 12 stops supplying the predetermined voltage to the target holder 6 upon lapse of just T/X seconds after the start of the n-th divisional deposition in step S47. Under this control, the deposition is performed on the substrate 10 just for T/X seconds.

In step S49, the control device 1000 judges whether or not the X divisional depositions are performed in reference to the count value associated with the number of divisional depositions and stored RAM 1003. If the count value is less than X, the control device 1000 judges that the X divisional depositions are not yet performed, and proceeds to step S47 to repeat steps S47 to S49. On the other hand, if the count value is equal to X, the control device 1000 judges that the X divisional depositions are already performed, and proceeds to step S50.

In step S50, the control device 1000 controls the substrate holder driving mechanism 31 so that the rotation of the substrate holder 7 being rotated at the fixed rotation speed in steps S44 to S49 is stopped. When the rotation of the substrate holder 7 is stopped in step S50, this film formation method is terminated.

Figure 5:
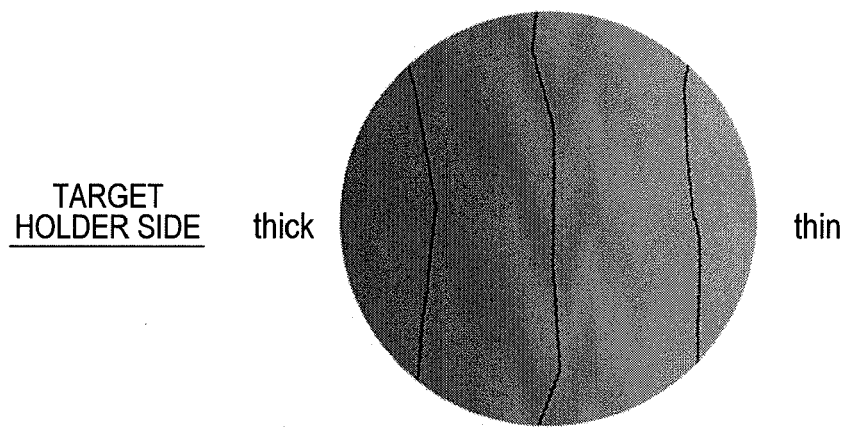
FIG. 5 is a view depicting a film thickness distribution in a case of deposition with a deposition start angle and a deposition end angle set to be the same.

Here, the deposition rate varies by a certain amount at the start of deposition. For example, in the case of sputter in a low-pressure atmosphere, the pressure needs to be set to be high temporarily at the start of discharge. For this reason, the deposition rate becomes higher temporarily at the start of deposition than the deposition rate in a stable state. In the case where deposition is performed for 4 seconds at a rotation speed of the substrate holder of 60 rpm, the deposition start angle and the deposition end angle are the same as each other. Even in this case, a film thickness distribution occurs as follows. Specifically, assuming that the point closest to the target holder is set as the point at a rotation angle of 0 degrees, the film thickness on the 0-degree side (the target holder side) is large while the film thickness on the 180-degree side (the opposite side to the target holder side) is small, as illustrated in FIG. 5.

Figure 6:
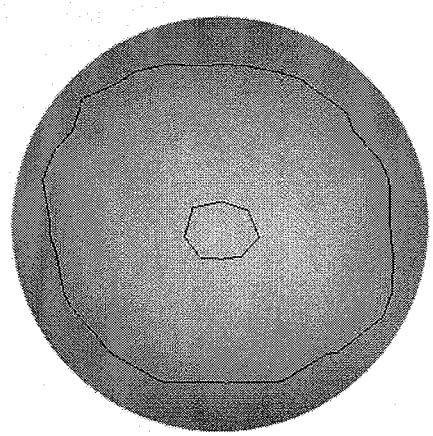
FIG. 6 is a view for explaining a film thickness distribution after a targeted deposition according to an embodiment of the present invention is terminated.

In contrast to this, in this embodiment, the deposition time T is divided by X. For each deposition of X divisional depositions, provided that a given point on the circumference of the substrate is set as a reference, the deposition where a film thickness distribution is generated due to a variation in the deposition rate at the start of the deposition as illustrated in FIG. 5 is performed just for T/X seconds when the given point arrives at a rotation position different from the rotation positions of the other divisional depositions, and X depositions for T/X second (divisional depositions) are performed. Thus, in each of the divisional depositions, a direction of the film thickness distribution (for example, a direction in which the film varies from thick to thin in the film thickness distribution) is changed along the circumferential direction of the substrate, and hence the divisional depositions having respectively different directions of the film thickness distributions overall cancel out the film thickness distribution as a whole. FIG. 6 is a diagram illustrating the state of a film thickness distribution obtained by using this embodiment (X=2). Firstly, the first divisional deposition is started when the rotation angle θ=0 degrees, and the first divisional deposition is terminated after 2.0 seconds (a deposition time of 4.0/2 seconds)(the end of the first divisional deposition). Then, the deposition (second divisional deposition) is again started when the rotation angle θ=180 degrees (360/2 degrees), and the second divisional deposition is terminated after 2.0 seconds (the end of the second divisional deposition).

Figure 7A:
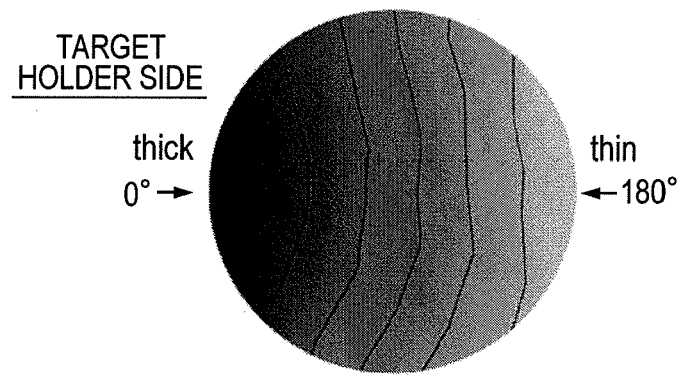
FIG. 7A is a view for explaining a film thickness distribution after a targeted deposition according to an embodiment of the present invention is terminated, the view depicting the film thickness distribution of a film formed by a first divisional deposition.
Figure 7B:
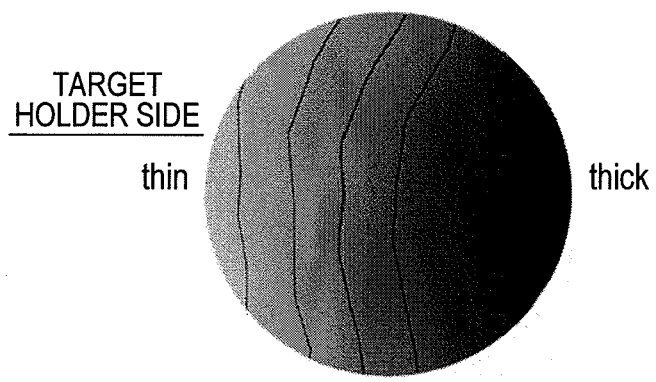
FIG. 7B is a view for explaining the film thickness distribution after a targeted deposition according to the embodiment of the present invention is terminated, the view depicting the film thickness distribution of a film formed by a second divisional deposition.

In this embodiment, assuming that the point closest to the target holder 6 is set as the point at the rotation angle θ of 0 degrees, a film formed by the first divisional deposition is thick on the 0-degree side in the film thickness distribution thereof, as illustrated in FIG. 7A. On the other hand, a film formed by the second divisional deposition is thick on the 180-degree side in the film thickness distribution thereof, as illustrated in FIG. 7B. In other words, the film thickness distribution in the first divisional deposition is almost symmetrical to the film thickness distribution in the second divisional deposition. Thus, in the targeted deposition, the film thickness distribution in the first divisional deposition and the film thickness distribution in the second divisional deposition are cancel out each other as a whole. Consequently, a film of which the film thickness distribution is reduced can be formed as illustrated in FIG. 6, even though the deposition rate is varied at the start of each deposition. To put it differently, in this embodiment, a deposition accompanied by the generation of a film thickness distribution is started when a predetermined point (for example, a reference point) formed in the substrate holding surface or the substrate comes to each of X different positions located at equal intervals in the outer circumferential direction of the substrate. Thus, the direction of the film thickness distribution is rotated at equal intervals among the films formed by the respective X divisional depositions, and therefore the film thickness distribution of the film formed by all the divisional depositions can be made isotropic. Thus, the film thickness distributions of the respective films formed by the X divisional depositions can be cancelled out each other when viewed in the overall film after the targeted deposition is completed.

Moreover, this embodiment is explained based on the case where the deposition end angle and the deposition start angle are the same in calculation, but this embodiment is also effective even in the case where the deposition end angle and the deposition start angle are not the same. In either case, since the thick portions and thin portions of the first divisional deposition and the second divisional deposition are symmetrical to each other or are generated at equal intervals in a rotation direction of the substrate, the film thickness distributions are cancelled out each other.

Second Embodiment

In this embodiment, the control (start and termination) of divisional depositions is carried out by controlling the open state and the close state of the target shutter 14 and/or the substrate shutter 19.

In the case of using the target shutter 14 and/or the substrate shutter 19, the deposition is controlled by exposure of the target 4 to the substrate 10 and by blockage of the exposure, while the discharge on the target 4 is continuously performed. For example, in the case of using the target shutter 14 and the substrate shutter 19, when both of the target shutter 14 and the substrate shutter 19 are switched from the close state to the open state under a condition where the plasma for sputter is generated, the target 4 is exposed to the substrate 10 and the deposition is stated. On the other hand, when both of the target shutter 14 and the substrate shutter 19 are switched from the open state to the close state in the deposition, the exposure of the target 4 to the substrate 10 is blocked and the deposition is interrupted.

In this case, however, the deposition rate varies by a certain amount at the start and end of the deposition due to opening and closing operations of the target shutter and the substrate shutter. For this reason, even if the deposition start angle and the deposition end angle are set to be the same with each other as in the technique disclosed in Japanese Patent Application Laid-Open No. 2001-240965, the film after the deposition has a film thickness distribution. According to this embodiment, the variations in the deposition rate at the start and end of the deposition can be cancelled out.

In this embodiment, the control device 1000 is configured to, while causing the substrate holder 7 (substrate holding surface 7a) to rotate at a fixed rotation speed by controlling the substrate holder driving mechanism 31 under the condition where the plasma is generated, control the target shutter driving mechanism 33 and the substrate holder drive means 31 in such a manner as to put the target shutter 14 and the substrate shutter 19 into the open state at the start of each of X divisional depositions and control the target shutter driving mechanism 33 and the substrate holder driving mechanism 31 in such a manner as to put the target shutter 14 and the substrate shutter 19 into the close state at the end of each of X divisional depositions. Specifically, the control device 1000 is configured to control the target shutter driving mechanism 33 and the substrate shutter driving mechanism 31, under the condition where the plasma is generated, in the first divisional deposition in such a manner as to put both of the target shutter 14 and the substrate shutter 19 into the open state with the rotation angle θ of the substrate holder 7 at the start of the first divisional deposition set to 0 degrees, and to put both of the target shutter 14 and the substrate shutter 19 into the close state in T/X seconds after the start of the first divisional deposition (when T/X seconds elapses after the start of the first divisional depositions). Moreover, the control device 1000 is configured to control the target shutter driving mechanism 33 and the substrate shutter driving mechanism 31, under the condition where the plasma is generated, in an n-th (n is an integer of 2 to X) divisional deposition in such a manner as to put both of the target shutter 14 and the substrate shutter 19 into the open state when the rotation angle θ of the substrate holder 7 from the start of the first divisional deposition becomes (n−1)×360/X degrees, and to put both of the target shutter 14 and the substrate shutter 19 into the close state in T/X seconds after the start of the n-th divisional deposition.

It should be noted that, although this embodiment is explained based on the configuration in which both of the target shutter 14 and the substrate shutter 19 are provided to control the start and termination of each of divisional depositions, this embodiment is applicable to a configuration in which only one of the target shutter 14 and the substrate shutter 19 is provided. Moreover, the shutters are not limited to the target shutter 14 and the substrate shutter 19, but may be any shutter provided at a predetermined location between the target holder 6 and the substrate holder 7, for example, at or near the middle point between the target holder 6 and the substrate holder 7. In addition, the number of shutters is not particularly limited either. In summary, what is important in this embodiment is to control the start and termination of each divisional deposition by making a blockage between the substrate and the target and by removing the blockage under the condition where the plasma is generated. Thus, any shutter can be used as long as the shutter is capable of forming both of a first state where the substrate holding surface 7a of the substrate holder 7 is exposed to the target holder 6 (the target 4 held by the target holder 6) and a second state where the substrate holding surface 7a is shut off from the target holder 6 (a state where the substrate holding surface 7a is not exposed to the target holder 6), and of switching between the first state and the second state.

Other Embodiments

The foregoing control device 1000 may be included in the deposition apparatus 1, or may be provided separately from the deposition apparatus 1. In the latter case, the control device 1000 may be incorporated in a PC (personal computer) or the like. In the case where the control device 1000 and the deposition apparatus 1 are provided separately as described above, the two may be connected to each other via a network such as a LAN or WAN, wired connection such as direct wiring connection, or wireless connection using infrared rays or the like.

In addition, the scope of the foregoing embodiments includes a processing method in which a program for causing the configurations of the foregoing embodiments to operate so as to implement the aforementioned functions of the control device 1000 of the embodiments is stored in a storage medium, and then the program stored in the storage medium is read as code and run by a computer. In other words, the computer-readable storage medium is also included in the scope of the embodiments. Further, the foregoing embodiments naturally include the storage medium in which the above computer program is stored, but also the computer program itself.

Exemplary media usable as such a storage medium are a floppy (registered trademark) disk, a hard disk, an optical disk, a magneto-optical disk, a CD-ROM, a magnetic tape, a non-volatile memory and a ROM.

Furthermore, the scope of the foregoing embodiments is not limited to one that executes the processing by using the program stored in the storage medium alone, but also includes one that executes the foregoing operations of the embodiments, while running on an OS, in collaboration with other software and functions of an extension board.

What is claimed is:

1. A sputter apparatus to generate plasma by applying a predetermined voltage to a target holder and to thereby form a film by sputtering a target held by the target holder comprising:

a process chamber;

a substrate holder provided inside the process chamber, having a substrate holding surface for holding a substrate, and configured to be capable of rotating the substrate holding surface about a predetermined rotation axis;

rotational drive means for controlling rotation of the substrate holder;

substrate rotation angle detection means for detecting a rotation angle of the substrate holder;

a target holder provided inside the process chamber and configured to be capable of holding the target, the target holder provided so that the rotation axis is located at a position different from a perpendicular line passing through the center point of the target;

a shutter configured to switch between a first state where the substrate holding surface is exposed to the target holder and a second state where the substrate holding surface is shut off from the target holder; and control means for controlling the rotational drive means and the shutter, the control means being provided with a storage unit, wherein, provided that T seconds denotes a deposition time required to form a film thickness to be obtained in a targeted deposition, the sputter apparatus is configured to be capable of performing X (X is an integer of 2 or larger) divisional depositions to complete the targeted deposition, and wherein the storage unit of the control means stores a control program, the control program executing the steps of:

controlling the rotational drive means so that the substrate holder is rotated at a fixed rotation speed;

controlling the shutter so that the first state is formed to start a first deposition of the divisional depositions, while the substrate holder is being rotated at the rotation speed under a condition where the plasma is being generated;

controlling the shutter so that the second state is formed in T/X seconds after the start of the first divisional deposition, while the substrate holder is being rotated at the rotation speed under the condition where the plasma is being generated;

controlling the shutter so that the first state is formed to start an n-th deposition of the divisional depositions when a reference point set on the substrate holder arrives at a position rotated by (n−1)×360/X degrees (n is an integer of 2 to X) from a position of the reference point located at the start of the targeted deposition, on the basis of a detection result obtained by the substrate rotation angle detection means, while the substrate holder is being rotated at the rotation speed under the condition where the plasma is being generated; and controlling the shutter so that the second state is formed in T/X seconds after the start of the n-th divisional deposition, while the substrate holder is being rotated at the rotation speed under the condition where the plasma is being generated.

2. The sputter apparatus according to claim 1, wherein the shutter is at least one of a target shutter provided in a way covering the target holder and being capable of switching between the first state and the second state, and a substrate shutter provided in a way covering the substrate holding surface and being capable of switching between the first state and the second state.

3. A control device of a sputter apparatus to generate plasma by applying a predetermined voltage to a target holder and to thereby form a film by sputtering a target held by the target holder, the sputter apparatus including:
   a process chamber;
   a substrate holder provided inside the process chamber, having a substrate holding surface for holding a substrate, and configured to be capable of rotating the substrate holding surface about a predetermined rotation axis;
   rotational drive means for controlling rotation of the substrate holder;
   substrate rotation angle detection means for detecting a rotation angle of the substrate holder;
   a target holder provided inside the process chamber and configured to be capable of holding the target, the target holder provided so that the rotation axis is located at a position different from a perpendicular line passing through the center point of the target; and
   a shutter configured to switch between a first state where the substrate holding surface is exposed to the target holder, and a second state where the substrate holding surface is shut off from the target holder,
   wherein the control device is configured to control the sputter apparatus so that the sputter apparatus performs X (X is an integer of 2 or larger) divisional depositions to complete a targeted deposition, provided that T seconds denotes a deposition time required to form a film thickness to be obtained in the targeted deposition, and
   wherein the control device includes a storage unit which stores a control program, the control program executing the steps of:
      controlling the rotational drive means so that the substrate holder is rotated at a fixed rotation speed;
      controlling the shutter so that the first state is formed to start a first deposition of the divisional depositions while the substrate holder is being rotated at the rotation speed under a condition where the plasma is being generated;
      controlling the shutter so that the second state is formed in T/X seconds after the start of the first divisional deposition, while the substrate holder is being rotated at the rotation speed under the condition where the plasma is being generated;
      controlling the shutter so that the first state is formed to start an n-th deposition of the divisional depositions when a reference point set on the substrate holder arrives at a position rotated by $(n-1) \times 360/X$ degrees (n is an integer of 2 to X) from a position of the reference point located at the start of the targeted deposition, on the basis of a detection result obtained by the substrate rotation angle detection means, while the substrate holder is being rotated at the rotation speed under the condition where the plasma is being generated; and
      controlling the shutter so that the second state is formed in T/X seconds after the start of the n-th divisional deposition, while the substrate holder is being rotated at the rotation speed under a condition where the plasma is being generated.

4. A sputter apparatus to generate plasma by applying a predetermined voltage to a target holder and to thereby form a film by sputtering a target held by the target holder comprising:
   a process chamber;
   a substrate holder provided inside the process chamber, having a substrate holding surface for holding a substrate, and configured to be capable of rotating the substrate holding surface about a predetermined rotation axis;
   rotational drive means for controlling rotation of the substrate holder;
   substrate rotation angle detection means for detecting a rotation angle of the substrate holder;
   a target holder provided inside the process chamber and configured to be capable of holding the target, the target holder provided so that the rotation axis is located at a position different from a perpendicular line passing through the center point of the target;
   a shutter configured to switch between a first state where the substrate holding surface is exposed to the target holder, and a second state where the substrate holding surface is shut off from the target holder; and
   control means for controlling the rotational drive means and the shutter, the control means being provided with a storage unit,
   wherein, provided that T seconds denotes a deposition time required to form a film thickness to be obtained in a targeted deposition, the sputter apparatus is configured to be capable of performing X (X is an integer of 2 or larger) divisional depositions to complete the targeted deposition, and
   wherein the storage unit of the control means stores a control program, the control program executing the steps of:
      rotating the substrate holder at a fixed rotation speed; and
      performing the targeted deposition by carrying out X (X is an integer of 2 or larger) divisional depositions while rotating the substrate holder at the rotation speed, each of the divisional depositions including performing a deposition for T/X seconds,
   wherein the step of performing the targeted deposition includes the steps of:
      starting a first deposition of the divisional depositions while rotating the substrate holder at the rotation speed;
      terminating the first divisional deposition in T/X seconds after the start of the first divisional deposition while rotating the substrate holder at the rotation speed;
      starting an n-th deposition of the divisional depositions when a reference point set on the substrate holder arrives at a position rotated by $(n-1) \times 360/X$ degrees (n is an integer of 2 to X) from a position of the reference point located at the start of the targeted deposition, while rotating the substrate holder at the rotation speed; and
      terminating the n-th divisional deposition in T/X seconds after the start of the n-th divisional deposition while rotating the substrate holder at the rotation speed.

5. A sputter apparatus to generate plasma by applying a predetermined voltage to a target holder and to thereby form a film by sputtering a target held by the target holder comprising:

a process chamber;

a substrate holder provided inside the process chamber, having a substrate holding surface for holding a substrate, and configured to be capable of rotating the substrate holding surface about a predetermined rotation axis;

rotational drive means for controlling rotation of the substrate holder;

substrate rotation angle detection means for detecting a rotation angle of the substrate holder;

a target holder provided inside the process chamber and configured to be capable of holding the target, the target holder provided so that the rotation axis is located at a position different from a perpendicular line passing through the center point of the target;

a shutter configured to switch between a first state where the substrate holding surface is exposed to the target holder, and a second state where the substrate holding surface is shut off from the target holder; and control means for controlling the rotational drive means and the shutter, the control means being provided with a storage unit, a RAM for temporarily storing therein data under a processing operation in a CPU or input data, and a non-volatile memory for storing the number of X as a X value, wherein, provided that T seconds denotes a deposition time required to form a film thickness to be obtained in a targeted deposition, the sputter apparatus is configured to be capable of performing X (X is an integer of 2 or larger) divisional depositions to complete the targeted deposition, and wherein the storage unit of the control means stores a control program, the control program executing the steps of:

a first step of storing a deposition rate and a targeted film thickness in the RAM;

a second step of reading the deposition rate and the targeted film thickness stored in the RAM in the first step, calculating the deposition time T of the targeted deposition based on the read deposition rate and targeted film thickness, and storing the deposition time T in the RAM;

a third step of reading the X value from the non-volatile memory, reading the deposition time T calculated in the second step from the RAM, calculating T/X, and storing the thus calculated T/X in the RAM, the T/X being equivalent to a deposition time for each of the divisional depositions;

a fourth step of controlling the rotational drive means so that the substrate holder is rotated at a predetermined rotation speed;

a fifth step of controlling a power supply for supplying a voltage to the target holder so that the power supply supplies a predetermined voltage to the target holder, thereby causing a first divisional deposition of the divisional depositions to start;

a sixth step of controlling the power supply so that the power supply stops supplying the predetermined voltage to the target holder upon lapse of T/X seconds after the start of the first divisional deposition started in the fifth step;

a seventh step of causing an n-th divisional deposition of the divisional depositions to start by controlling the power supply so that the power supply supplies a predetermined voltage to the target holder, when a rotation angle $\theta$ of a reference point set on the substrate or on the substrate holder from a position as a start position of the targeted deposition becomes $(n-1) \times 360/X$ degrees, based on rotation information received from the substrate rotation angle detection means;

an eighth step of reading the T/X from the RAM, and controlling the power supply so that the power supply stops supplying the predetermined voltage to the target holder upon lapse of just T/X seconds after the start of the n-th divisional deposition in the seventh step;

a ninth step of judging whether or not the X divisional depositions have been performed in reference to a count value associated with the number of divisional depositions and stored in the RAM; and a tenth step of controlling the rotational drive means so that the rotation of the substrate holder being rotated in the fourth to ninth steps is stopped to terminate forming the film, if it is judged in the ninth step that the X divisional depositions have been already performed.

* * * * *